United States Patent
Ishikawa et al.

(10) Patent No.: US 6,600,214 B2
(45) Date of Patent: Jul. 29, 2003

(54) ELECTRONIC COMPONENT DEVICE AND METHOD OF MANUFACTURING THE SAME

(75) Inventors: Kazumitsu Ishikawa, Kanagawa (JP); Hiroyuki Kudoh, Kanagawa (JP); Masayuki Sakurai, Kanagawa (JP)

(73) Assignee: Hitachi AIC Inc. (JP)

( * ) Notice: Subject to any disclaimer, the term of this patent is extended or adjusted under 35 U.S.C. 154(b) by 62 days.

(21) Appl. No.: 09/855,476

(22) Filed: May 14, 2001

(65) Prior Publication Data

US 2002/0020896 A1 Feb. 21, 2002

(30) Foreign Application Priority Data

| May 15, 2000 | (JP) | ................................ 2000-141333 |
| May 25, 2000 | (JP) | ................................ 2000-154808 |
| Aug. 3, 2000 | (JP) | ................................ 2000-235086 |
| Nov. 27, 2000 | (JP) | ................................ 2000-359056 |

(51) Int. Cl.$^7$ .............................................. H01L 29/06
(52) U.S. Cl. ........................ 257/622; 257/679; 257/680
(58) Field of Search ..................... 29/593, 852, 854, 29/856; 257/622, 679, 680, 690; 385/59, 75, 89

(56) References Cited

U.S. PATENT DOCUMENTS

| 5,052,103 A | * | 10/1991 | Saitou .......................... 29/852 |
| 5,383,095 A | * | 1/1995 | Korsunsky et al. ............ 361/785 |
| 5,488,765 A | * | 2/1996 | Kubota et al. .............. 29/25.42 |
| 5,499,447 A | * | 3/1996 | Murakami ................... 174/260 |
| 6,091,137 A | * | 7/2000 | Fukuda ......................... 257/679 |
| 6,257,771 B1 | * | 7/2001 | Okayasu ....................... 385/59 |

* cited by examiner

Primary Examiner—David Nelms
Assistant Examiner—Dao H. Nguyen
(74) Attorney, Agent, or Firm—Blakely, Sokoloff Taylor & Zafman

(57) ABSTRACT

An electronic component device includes a printed wiring board having a side surface terminal portion formed of a recessed groove, filler, and plating conductor. The recessed groove is formed in a side surface, or a corner adjacent to the side surface, of a board and extending from an upper surface to a lower surface. The filler fills the groove and has a plating catalytic function. The plating conductor covers an exposed surface of the filler. A method of manufacturing the electronic component device is also disclosed.

5 Claims, 10 Drawing Sheets

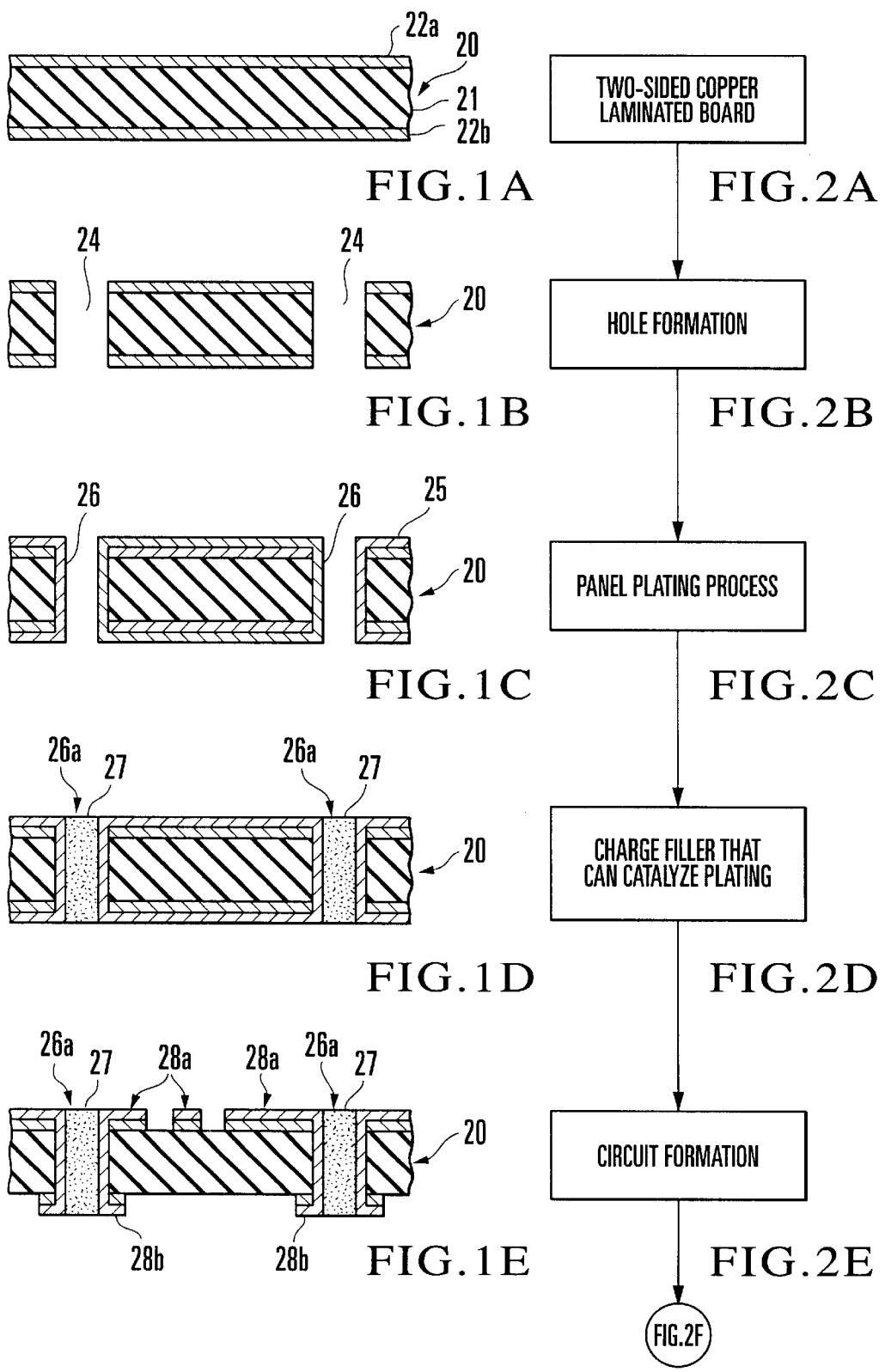

FIG.2F — CUT CONNECTION BLIND HOLE

FIG.2G — FORMATION OF PRINTED WIRING BOARD

FIG.2H — METAL PLATING PROCESS

FIG.2I — MOUNT ON MOTHER BOARD

TWO-SIDED COPPER LAMINATED BOARD → HOLE FORMATION → PANEL PLATING PROCESS → CHARGE FILLER THAT CAN CATALYZE PLATING → CIRCUIT FORMATION → ROUTER MACHINING → METAL PLATING PROCESS → OUTER SHAPE MACHINING

ELECTRONIC COMPONENT DEVICE AND METHOD OF MANUFACTURING THE SAME

BACKGROUND OF THE INVENTION

The present invention relates to an electronic component device and, more particularly, to an electronic component device, which has a side surface electrode or terminal portion in a recessed groove formed in a side surface or corner of a printed wiring board to extend from an upper surface to a lower surface, and on which a plurality of electronic component elements are mounted, and a method of manufacturing the same.

In general, as the device size decreases, not only components used by the device but also a printed wiring board on which the components are to be mounted must be downsized. Various improvements have been made to satisfy this requirement.

For example, as a method of mounting a plurality of electronic component elements, e.g., semiconductor elements or chip components, on a mother board, a method of temporarily mounting these plurality of electronic component elements on a printed wiring board (module board) and then mounting the printed wiring board on a mother board is available.

FIGS. 15 and 16 show a conventional printed wiring board manufacturing method and a state wherein a printed wiring board is mounted on a mother board, respectively.

Referring to FIG. 15, a two-sided metal laminated board 1 or so-called a large-sized board has a large outer shape. A large number of (nine in this example for the sake of convenience) printed wiring boards 2 are formed from the metal laminated board 1, and are mounted on a mother board 10, as shown in FIG. 16.

The conventional printed wiring board manufacturing method will briefly be described. A large number of through holes 4 are formed in the metal laminated board 1 by drilling along cutting lines 3 of the printed wiring boards 2 to be formed.

The metal laminated board 1 is plated, and is cut at the cutting lines 3, including the through holes 4, to form individual printed wiring boards 2 on the upper surface (if necessary, the lower surface as well) of the metal laminated board 1. On each printed wiring board 2, circuit conductors 5 and connection lands 6 are formed. The through holes 4 have been plated to form connection grooves 7 (by cutting along the through holes) at side surfaces, or corners adjacent to the side surfaces, of the resultant printed wiring boards, to extend from the upper surface to the lower surface, and to serve as plated side surface electrodes.

Electronic component elements 8 are attached to the connection lands 6 of each printed wiring board 2, formed in this manner, through solder 9. After that, solder 12 is heated to connect the side surface electrodes 7, formed in the side surfaces, or corners adjacent to the side surfaces, of the printed wiring boards 2, to lands 11 of the mother board 10, thereby mounting the printed wiring boards 2 on the mother board 10 such that they are connected to necessary portions on the mother board 10.

In each conventional printed wiring board 2 described above, since the connection grooves 7 serving as the side surface electrodes are hollow, as shown in FIG. 17, when the printed wiring board 2 is to be cut at the cutting lines 3 by press or router machining, a metal portion 7a to be cut may partly electrically deform and peel. The peeled metal portion 7a may form a metal burr 7b and enter the corresponding connection groove 7 which is to serve as a side surface electrode. The metal burr 7b may remain in the connection groove 7, as shown in FIG. 18. As a result, a plating conductor for forming the connection groove 7 of the side surface electrode tends to peel easily from the base material of the printed wiring board 2 due to the metal burr 7b. Then, the adhesion strength becomes short, and the conductor resistance of the connection groove 7 increases, thereby decreasing the reliability of electrical connection.

Since the connection grooves 7 to serve as the side surface electrodes are hollow, it is difficult to mount the electronic component elements 8 directly on the connection grooves 7. For this reason, in order to mount the electronic component elements 8 in other than the connection grooves 7, as shown in FIG. 19, lands 14 for mounting are formed independently of the lands of the connection grooves 7.

Accordingly, a distance L1 between the side surface of the printed wiring board 2 to the far end of the electronic component element 8 increases by a length AL of the corresponding land 14, and consequently the outer size of the printed wiring board 2 increases.

To allow each connection groove 7 to serve as the side surface electrode, a width C of the land (conductor) of the connection groove 7 cannot be decreased more than necessary, and a land diameter D1 of the connection groove 7 becomes larger than the connection hole diameter by twice (2C) the land diameter. Therefore, to decrease a pitch 11 among the connection grooves 7 is limited. As a result, downsizing of the printed wiring board 2 is interfered with.

As described above, since the conventional plated connection groove 7 which is to serve as the side surface electrode is hollow, when the electronic component element 8 is to be mounted in the connection groove 7 and encapsulated with a mold resin or the like, resin leakage occurs from the connection grooves 7, degrading the reliability.

SUMMARY OF THE INVENTION

It is, therefore, the principal object of the present invention to provide an electronic component device in which the connection reliability of a side surface terminal, formed in the side surface, or in a corner adjacent to the side surface, of a printed wiring board so as to continuously extend from the upper surface to the lower surface of the printed wiring board, is stabilized, and a method of manufacturing the same.

It is another object of the present invention to provide an electronic component device which can be downsized to be smaller than that of the prior art and which can enable high-density mounting of electronic component elements, and a method of manufacturing the same.

It is still another object of the present invention to provide an electronic component device which can be efficiently manufactured to improve productivity, and a method of manufacturing the same.

In order to achieve the above objects, according to an embodiment of the present invention, there is provided an electronic component device comprising a printed wiring board including a side surface terminal portion formed of a recessed groove formed in a side surface, or a corner adjacent to the side surface, of a board and extending from an upper surface to a lower surface, a filler which fills the groove and has a plating catalytic function, and a plating conductor covering an exposed surface of the filler.

BRIEF DESCRIPTION OF THE DRAWINGS

FIGS. 1A to 1I are sectional views showing the steps in a printed wiring board manufacturing method according to an embodiment of the present invention;

FIGS. 2A to 2I are views showing the flow along the steps shown in FIGS. 1A to 1I;

DESCRIPTION OF THE PREFERRED EMBODIMENTS

Figure 1F:
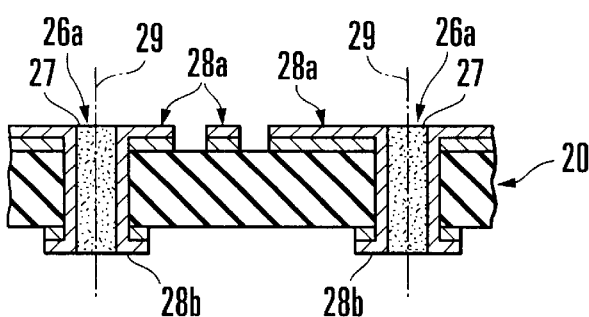

The preferred embodiments of the present invention will be described with reference to the accompanying drawings.
First Embodiment FIGS. 1A to 1I, 2A to 2I, 3, 4, 5, 6, 7, 8, and 9 show an embodiment of the present invention. A printed wiring board characterized by the present invention will be described with reference to these drawings in the order of its manufacturing steps.

Referring to FIGS. 1A and 2A, a two-sided copper laminated board 20 is a metal laminated board formed by laminating copper foils 22a and 22b on the upper and lower surfaces of a so-called large-sized insulating board 21 with a large outer shape.

Referring to FIGS. 1B and 2B, the two-sided copper laminated board 20 with the above structure is subjected to hole formation with a drill to form through holes 24 at predetermined portions on cutting lines 29 (to be described later).

Referring to FIGS. 1C and 2C, the inner walls of the through holes 24 and the entire upper and lower surfaces of the two-sided copper laminated board 20 are subjected to panel plating by electroless copper plating or electrolytic copper plating to form copper plating conductors 25 serving as the first metal plating conductors, and metal-plated connection through holes 26 for electrically connecting the copper foils (conductor patterns) on the upper and lower surfaces of the two-sided copper laminated board 20.

As panel plating described above, an insulating board 21 such as a multilayered board, the surface of the base material of which is not laminated with a metal foil such as a copper foil, may be subjected to additive process plating, so that copper plating conductors 25 (conductor patterns) may be formed on the inner walls of through holes 24 and at predetermined portions of the upper and lower surfaces of the insulating board 21.

Referring to FIGS. 1D and 2D, a screen (not shown) is placed on the resultant structure, and a conductive or non-conductive filler 27 having a plating catalytic function is charged with a pressure into the connection through holes 26 of the two-sided copper laminated board 20 at room temperature from the outer surface of the metal laminated board by forcing or by printing in accordance with squeezing, so the connection through holes 26 become connection blind holes 26a. The filler 27 is typically a copper paste and its particle size is, e.g., about 6 μm to 8 μm. The charging pressure is $(3.43 \text{ to } 6.37)*10 \text{ N/m}^2$.

Referring to FIGS. 1E and 2E, a predetermined circuit pattern is formed by known etching, to form conductor patterns 28a, including the connection blind holes 26a, on the upper surface of the two-sided copper laminated board 20, and lands 28b around the connection blind holes 26a in the lower surface of the two-sided copper laminated board 20.

Alternatively, the conductor patterns 28a may be formed on the two surfaces of the two-sided copper laminated board 20 to sandwich the connection blind holes 26a. It suffices as far as the conductor patterns 28a are formed at least on either surface. After that, a solder resist is formed if necessary.

As shown in FIGS. 1F and 2F, the resultant two-sided copper laminated board 20 is separated by cutting at the cutting lines 29 corresponding to the printed wiring boards to be formed, by router or slitter machining to partially across the connection blind holes 26a. More specifically, the large-sized printed wiring board is separated by cutting into a large number of desired individual printed wiring boards.

Figure 1G:
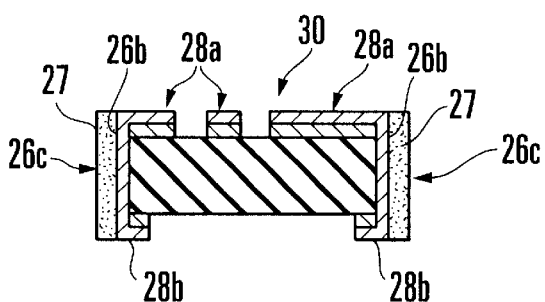

As shown in FIGS. 1G and 2G, the connection blind holes 26a, charged with the filler 27 having a plating catalytic function on the side surface of each individual printed wiring board 30, are partly divided by cutting, thereby forming side surface connection portions 26c each comprised of a recessed groove 26b in contact with the side surface and continuous from the upper surface to the lower surface and the filler 27 (e.g., copper paste) charged in the groove 26b and having a plating catalytic function.

When the two-sided copper laminated board 20 is to be cut at the cutting lines 29 by router machining or the like, in this embodiment, since the filler 27 is charged in the connection blind holes 26a unlike in the prior art, formation of metal burrs on the cutting sections of the connection blind holes 26a as in the prior art can be suppressed. According to this embodiment, since the metal plating conductors are deposited on the exposed filler of the side surface connection portions 26c and on the surfaces of the conductor patterns by electroless metal plating (to be described later), the metal plating conductors do not peel from the base material of the printed wiring board 30 or the filler. As a result, the quality is stabilized and the reliability is improved.

Figure 3:
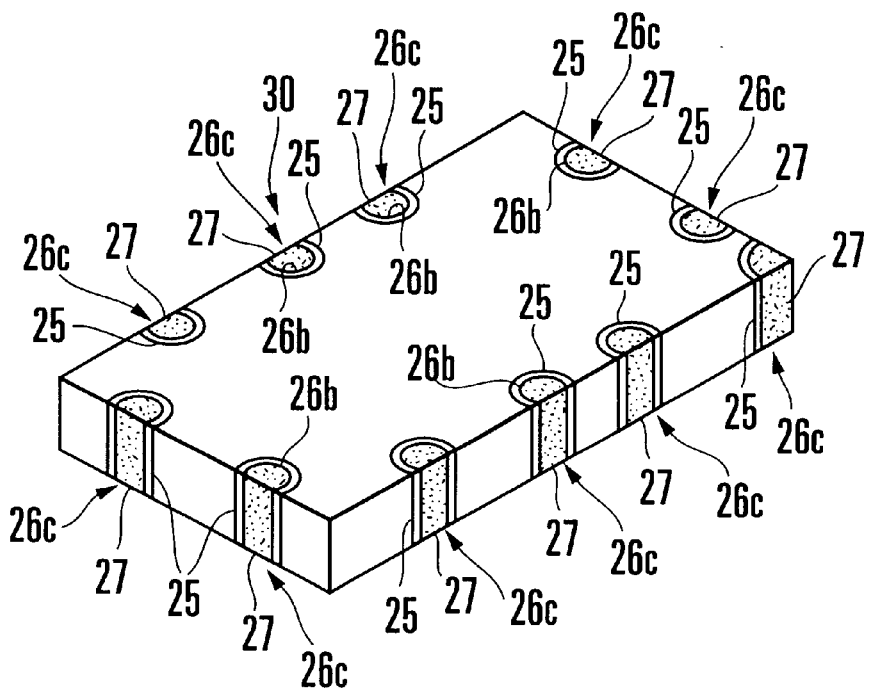
FIG. 3 is a perspective view showing a state wherein a large-sized metal laminated board is separated into individual printed wiring boards by cutting.

More specifically, as shown in FIG. 3, the large number of recessed grooves 26b continuous from the upper surface to the lower surface are formed on the outer side surface of the printed wiring board 30. The large number of semicylindrical side surface connection portions 26c, comprised of the filler 27 charged inside the plating conductors 25 formed on the inner walls of the grooves 26b, form smooth planar end faces on the outer side surfaces.

Alternatively, recessed grooves 26b may be formed not only on one end face of the outer side surface of the printed wiring board 30 but also on the corners of the printed wiring board 30 to each extend across two side surfaces. Side surface connection portions 26c, comprised of the grooves 26b and filler 27 charged in the grooves 26b and having a plating catalytic function, may be formed. A plurality of very small side surface connection portions 26c can thus be formed at a high density in this manner. For example, very small side surface connection portions 26c, the grooves of which are exposed to their outer side surfaces with a width of 0.3 mm to 0.1 mm, can be formed.

Figure 4:
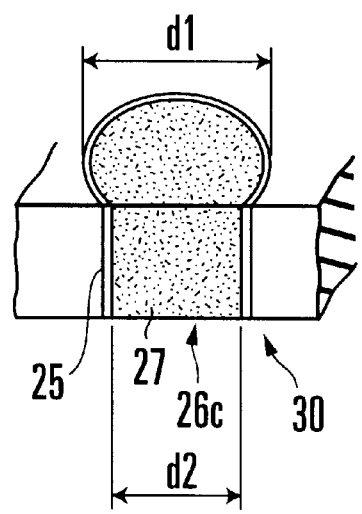
FIG. 4 is an enlarged perspective view of a side surface terminal portion shown in FIG. 3.

As shown in FIG. 4, in order to further increase the adhesion strength between the base material of the printed wiring board 30 and the side surface connection portions 26c, the side surface connection portions 26c are formed such that the maximum widths (d1) of their buried portions are larger than their groove widths (d2) with which they are exposed to the outer side surfaces, so that an anchor effect can be obtained. For example, when D-shaped cylindrical or inverted trapezoidal side surface connection portions 26c, 60% or more of the cylindrical shape of each of which is buried in the side surface, are formed, the connection strength (adhesion strength) between the base material of the printed wiring board 30 and the side surface connection portions 26c can be increased greatly, so that the quality can be stabilized with respect to the weight and load of the mounted components, and the reliability can be improved.

Figure 1H:
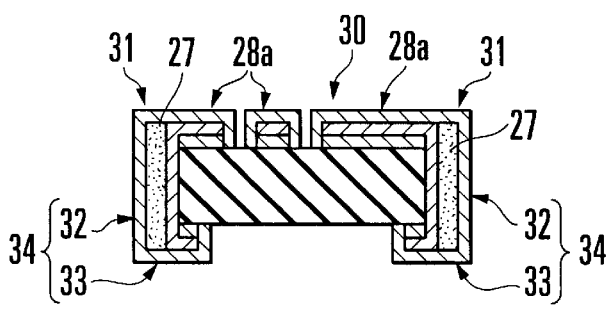

Subsequently, referring to FIGS. 1H and 2H, electroless metal plating is performed without performing a plating catalytic process, thereby forming metal plating films on the exposed surfaces of the filler 27 having a plating catalytic function and on the conductor patterns 28a. In other words, no metal plating films are formed on the cutting sections or upper surface of an insulating board, which is an insulator as it is not subjected to a plating catalytic process. Accordingly, the metal plating films are formed on only the upper and lower surfaces and cutting sections of the filler 27 exposed to the outside of the side surface connection portions 26c formed by dividing the connection blind holes 26a by cutting. The metal plating films cover the side surface connection portions 26c, thereby forming side surface terminal portions 34 each comprised of an upper surface terminal portion 31, side surface terminal portion 32, and lower surface terminal portion 33.

Figure 5:
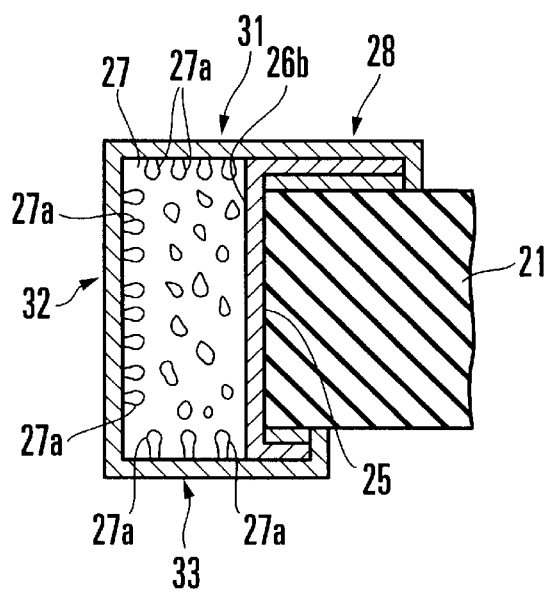
FIG. 5 is a sectional view showing a side surface terminal portion according to another example.
Figure 6:
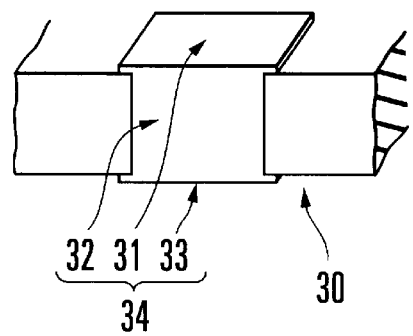
FIG. 6 is a perspective view of FIG. 5.

More specifically, as shown in FIGS. 5 and 6, the side surface terminal portions 34, each with a three-layered structure comprised of the plating conductor 25 on the inner wall of the corresponding groove 26b, the filler 27 charged in the groove 26b and having a plating catalytic function, and a plating conductor 28 covering the exposed surface of the filler 27, are formed on the outer side surface. The side surface terminal portion 32 forms a smooth planar side surface. Since the conductor patterns on the upper and lower surfaces of the printed wiring board 30 are connected to each other with two plating conductors, i.e., the plating conductors 25 on the wall surfaces of the grooves 26b and the external plating conductors 28 that cover the side surface connection portions 26c, the electrical connection reliability is improved.

Since the connection blind holes 26a are filled with the filler 27, e.g., a copper paste, having a plating catalytic function, particles 27a in the filler 27 serve as an anchor due to the anchor effect of the plating catalytic function, so the adhesion properties between the filler 27 and the metal plating films increase. Since the external plating conductors 28 serving as the second metal plating films cover the side surface connection portions 26c, the adhesion strength between the base material of the printed wiring board 30 and the side surface terminal portions 34 can be further increased. Consequently, the side surface terminal portions 34 can be prevented from peeling from the printed wiring board 30, so the quality is stabilized and the connection reliability is improved.

If the filler 27 charged in the connection blind holes 26a do not have the plating catalytic function, only predetermined portions must be subjected to the plating catalytic process, leading to cumbersome operation.

Figure 1I:
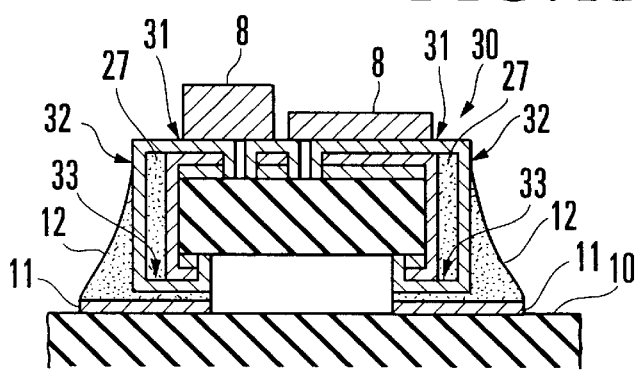

As shown in FIGS. 1I and 2I, electronic component elements 8 such as a resistor, capacitor, or transistor are mounted on the conductor patterns 28a or the upper surface terminal portions 31 of the printed wiring board 30, and the printed wiring board 30 is heated on lands 11 of a mother board 10 through a solder 12 such that the lands 11 of the mother board 10 and the lower surface terminal portions 33 as part of the side surface terminal portions 34 of the printed wiring board 30 are horizontal to each other. Hence, the lands 11 of the mother board 10 and the lower surface terminal portions 33 and side surface terminal portions 32 of the printed wiring board 30 are connected to each other through the solder 12, so the printed wiring board 30 on which the electronic component elements 8 are mounted is attached to the mother board 10.

Alternatively, in FIGS. 1D and 2D described above, a panel plating step by means of electroless copper plating or electrolytic copper plating shown in FIGS. 1C and 2C may be omitted, and a conductive or nonconductive filler having a plating catalytic function may be charged with a pressure into the non-plated through holes 24 in the two-sided copper laminated board 20 at room temperature from the outer surface of the metal plated board, so the through holes 24 form blind holes.

More specifically, each side surface terminal portion 34 may be formed to have a recessed groove formed in the side surface, or a corner adjacent to the side surface, of the printed wiring board and extending from the upper surface to the lower surface continuously, a filler charged in the groove and having a plating catalytic function, and a plating conductor covering the exposed surface of the filler.

More specifically, even when the first metal plating conductor 25 (e.g., a copper plating conductor) is not formed in the step shown in FIGS. 1C and 2C, if an electroless metal plating process is performed in the later step shown in FIGS. 1H and 2H, metal plating films are formed on the exposed surfaces of the filler having a plating catalytic function and on the conductor patterns. Then, the conductor patterns on the upper and lower surfaces of the printed wiring board are connected to each other with the external plating conductors 28 that cover the side surface connection portions 26c. As a result, the electrical connection reliability can be assured in the same manner as in the embodiment described above.

Figure 7:
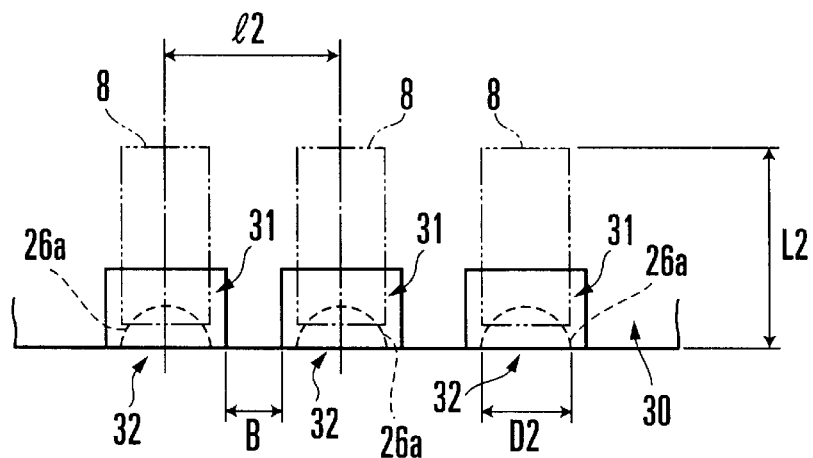
FIG. 7 is a view for explaining connection between side surface terminal portions and corresponding electronic component elements according to the present invention.
Figure 19:
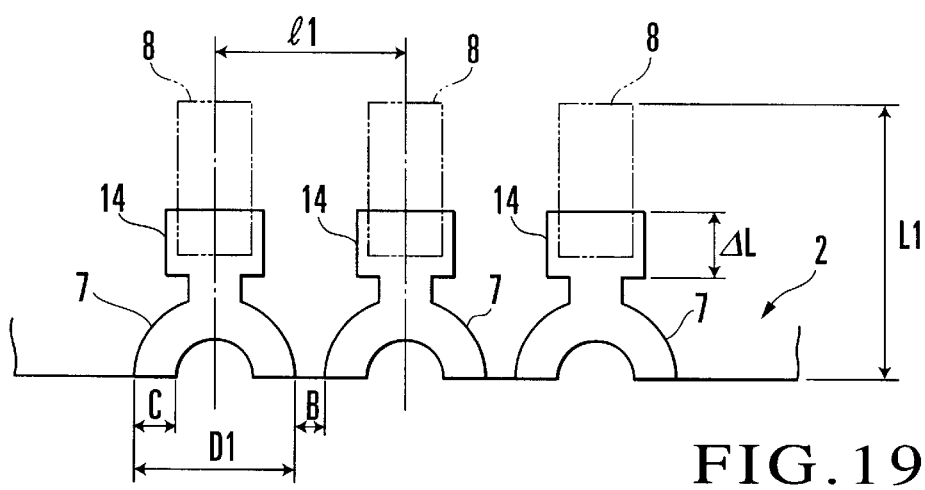
FIG. 19 is a plan view of the main part for describing a state wherein electronic component elements are mounted on a printed wiring board manufactured by the conventional printed wiring board manufacturing method.

In the printed wiring board 30 according to the present invention, as shown in FIG. 7, since the electronic component elements 8 are attached onto the upper surface terminal portions 31 covering the connection blind holes 26a, a distance L2 between the side surface of the printed wiring board 30 and the outer side surface of each electronic component element 8 can be decreased. Thus, not only the outer size of the printed wiring board 30 can be decreased, but also the electronic component elements 8 can be mounted at a high density. When mounting the printed wiring board 30 on the lands 11 of the mother board 10, it is done without using connection holes, but through the side surface terminal portions 32 covering the cutting sections of the connection blind holes 26a and the lower surface terminal portions 33. Consequently, a diameter D2 of each connection hole can be set to a necessary minimum value, so a mounting pitch 12 of the electronic component elements 8 can be set small, allowing downsizing of the printed wiring board 30 and electronic component elements 8. The widths of the upper surface terminal portions 31 and side surface terminal portions 32 can be largely decreased since the width C of the land of each connection groove 7 described in FIG. 19 as the prior art becomes unnecessary.

Regarding the printed wiring board 30 mounted on the mother board 10, since the connection blind holes 26a are formed by charging the filler 27 in the connection holes and accordingly the connection blind holes 26a are not hollow, when the printed wiring board 30 is to be mounted on the lands 11 of the mother board 10 by surface bonding, the adhesion of the solder 12 with respect to the side surface terminal portions 32 increases. Because of the presence of the lower surface terminal portions 33, the contact area between each lower surface terminal portion 33 and the corresponding land 11 of the mother board 10 is increased. Therefore, the lower surface terminal portions 33 and lands 11 can be connected to each other easily, and the connection resistance between the lower surface terminal portions 33 and lands 11 decreases, thereby reducing connection failures.

Note that the electric component elements 8 include not only a capacitor, resistor, and transistor, but also any other semiconductor element, any other light-receiving/light-emitting semiconductor element, and a liquid crystal display element. One of these elements is used as the electric component element 8.

Figure 8:
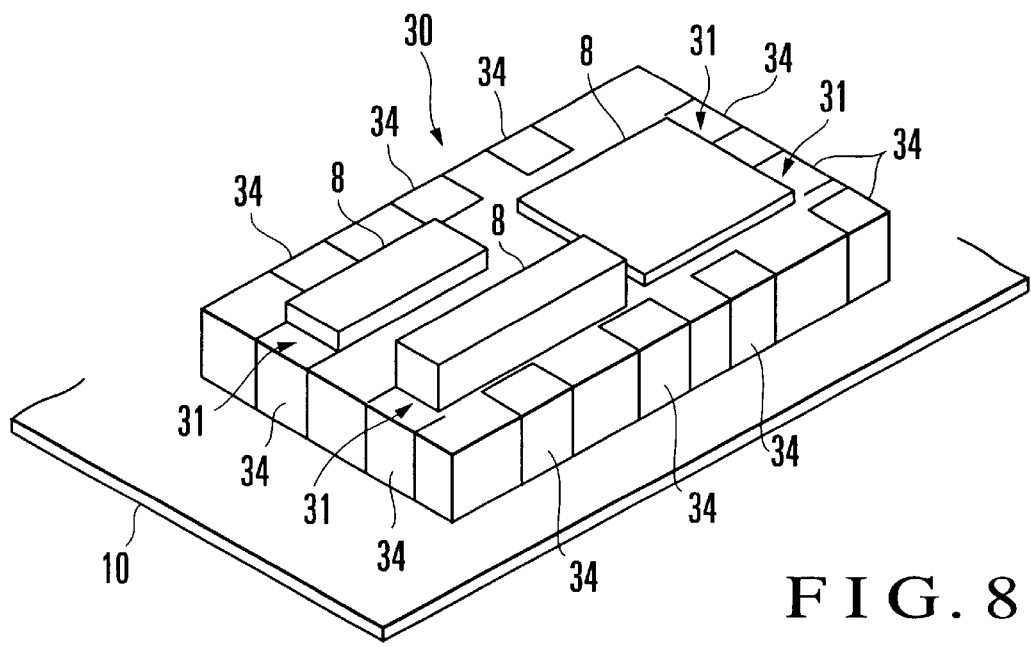
FIG. 8 is a perspective view showing a state wherein a printed wiring board on which electronic component elements are mounted is mounted on a mother board.

As shown in FIG. 8, in the side surface terminal portions 34, the connection through holes are filled with the filler charged in them and having a plating catalytic function, and the plating conductors cover the exposed side surfaces of the filler. Hence, nonuniformities are not formed on the outer side surface of the printed wiring board 30 mounted on the mother board 10. As the side surface terminal portions 32 form particularly smooth planar side surface terminal portions, the electronic component elements 8 can be connected to or mounted on them as well.

When a resin coating is to be formed on the printed wiring board 30 mounted on the mother board 10, the resin can easily be attached to the outer side surface of the printed wiring board 30. Similarly, when a shield cover is to be placed on the printed wiring board 30, nonuniformities are not formed on the outer shape of the shield cover, so the shape of the shield cover will not become complicated.

Figure 9:
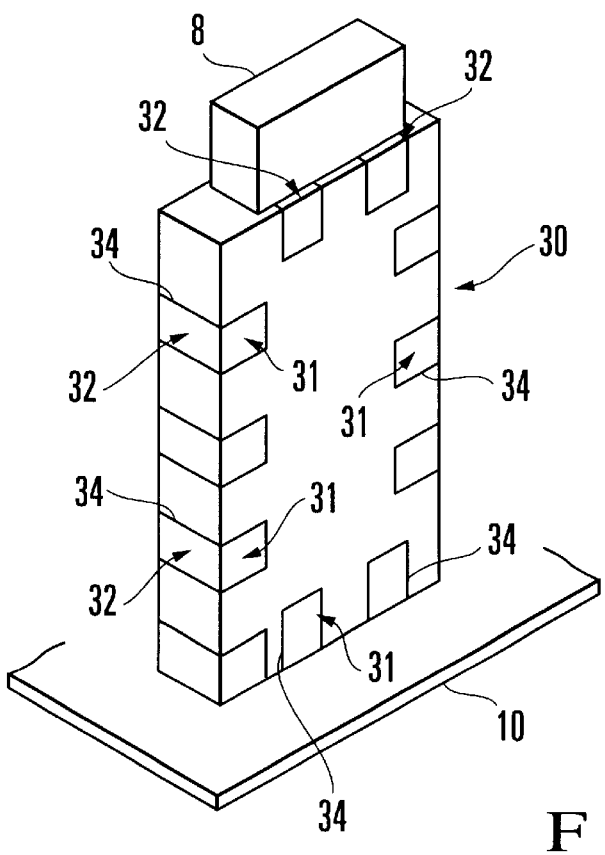
FIG. 9 is a perspective view showing a state wherein the printed wiring board is mounted on the mother board by another method.

As shown in FIG. 9, when the printed wiring board 30 is set vertically on the mother board 10 by mounting the side surface terminal portions 32 of its side surface terminal portions 34 on the mother board 10, the printed wiring board 30 can be mounted on a small area by surface bonding, thus achieving high-density mounting. Each side surface terminal portion 32 is formed of the filler charged in the recessed connection hole formed in the side surface, and a plating conductor covering the exposed surface of the filler, so as to form a smooth planar end face. Thus, when the printed wiring board 30 on which the electronic component elements 8 are mounted is to be mounted by surface bonding, it can be stably mounted such that it is connected to the mother board 10 through the side surface terminal portion 32. The adhesion properties of the solder 12 are improved accordingly, so the quality is improved and the connection reliability is stabilized.

In this embodiment, the electronic component elements 8 are directly connected to the side surface terminal portions 32 of the printed wiring board 30. The electronic component elements 8 can be light-receiving or light-emitting elements, sensor elements, and the like.

Figure 14:
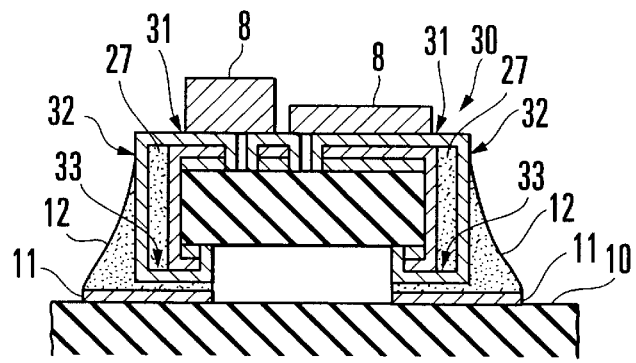
FIG. 14 is a sectional view showing another example of a printed wiring board on which electronic component elements are mounted.
Figure 15:
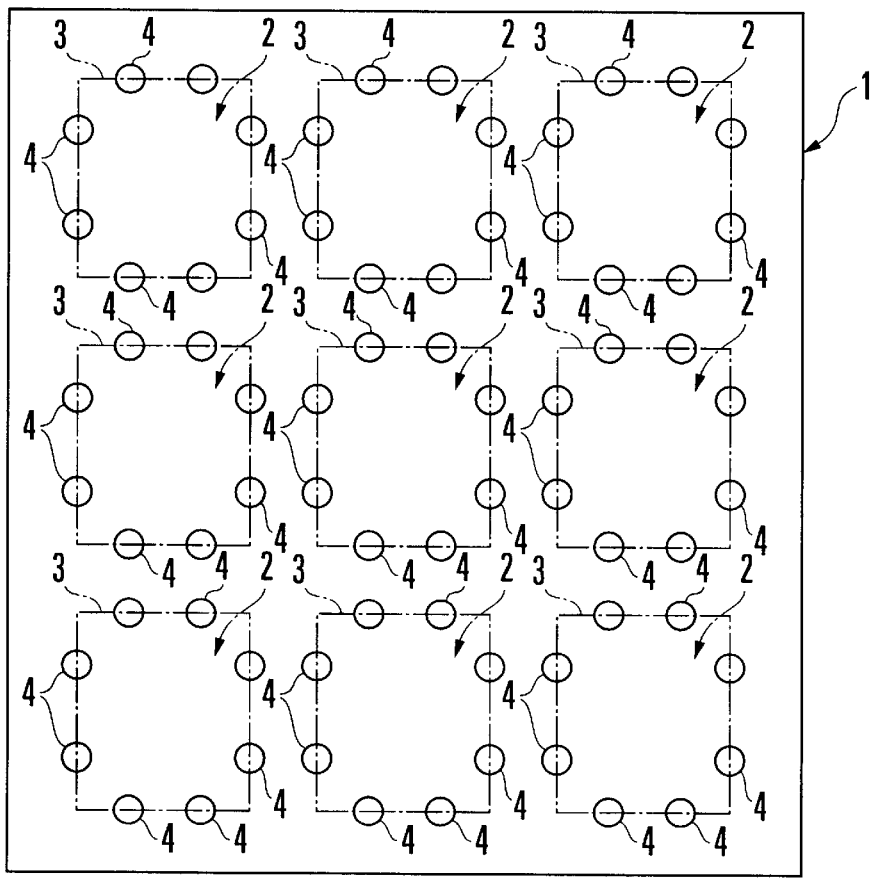
FIG. 15 is a plan view for schematically explaining a conventional printed wiring board manufacturing method.
Figure 16:
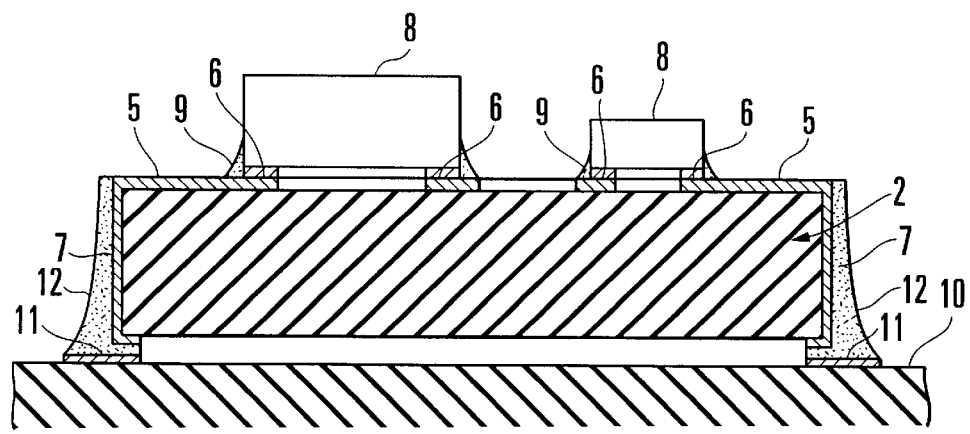
FIG. 16 is a sectional view showing a state wherein a conventional printed wiring board is mounted on a mother board.
Figure 17:
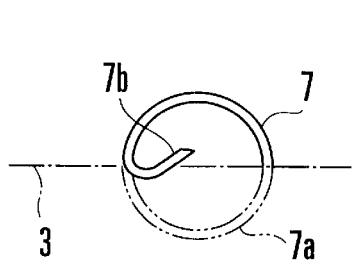
FIG. 17 is a plan view of the main part for explaining the cutting state of the printed wiring board manufactured by the conventional printed wiring board manufacturing method.
Figure 18:
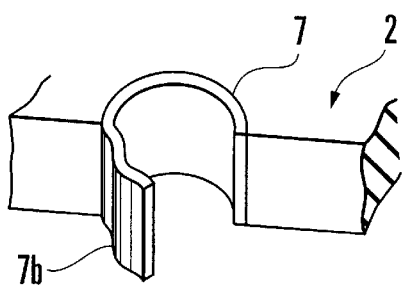
FIG. 18 is a perspective view, in connection with FIG. 17, of the main part showing the state of the conventional printed wiring board after cutting.

If the electronic component elements 8 mounted on the printed wiring board 30 shown in FIGS. 1I and 2I are covered with an insulating material, as shown in FIG. 14, the electronic component elements 8 or the connecting portions can be protected from humidity or water.

Second Embodiment

Figure 10:
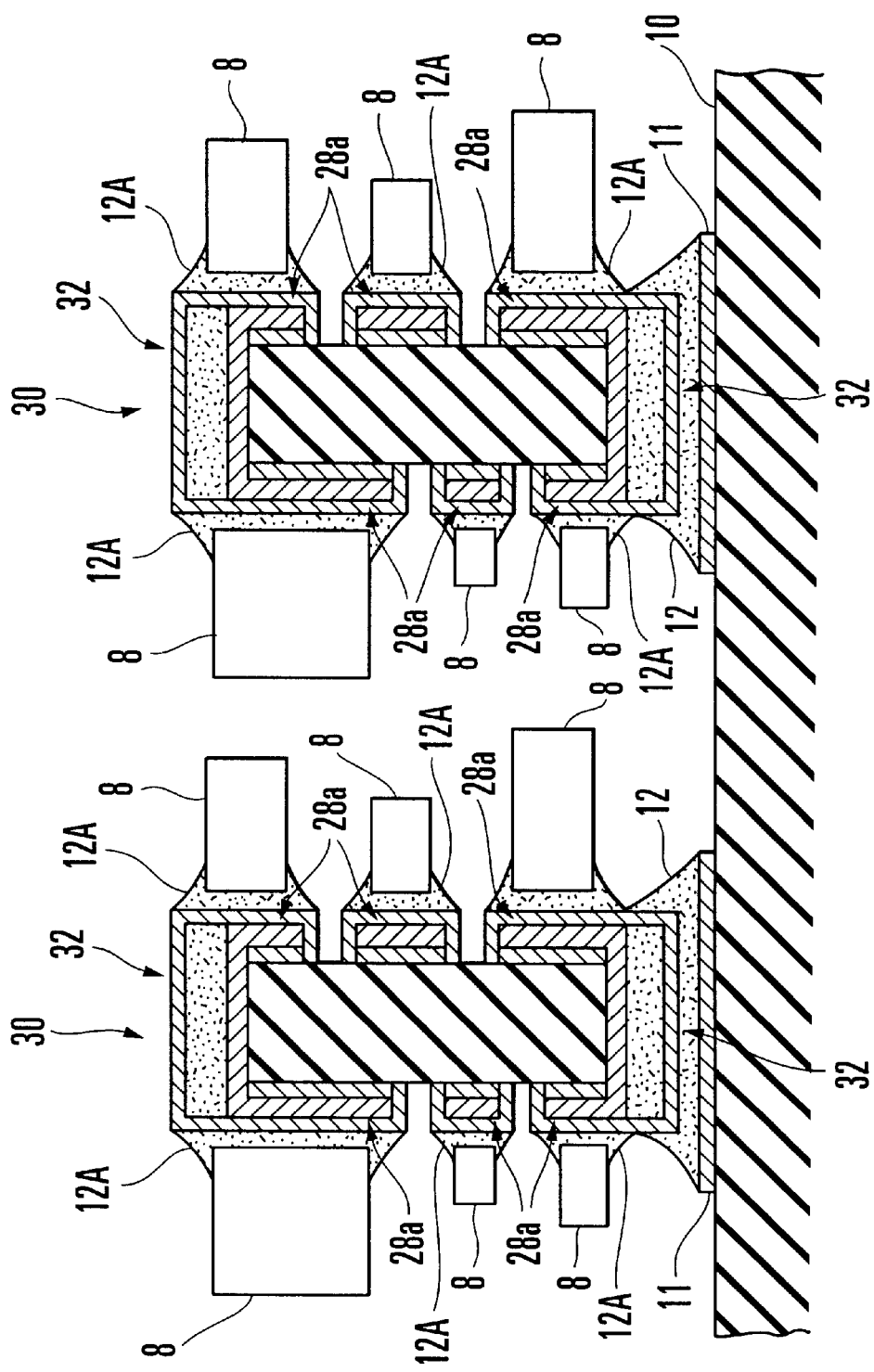
FIG. 10 is a sectional view showing a state wherein printed wiring boards according to the second embodiment of the present invention, on which electronic component elements are mounted, are attached to a mother board.
Figure 11:
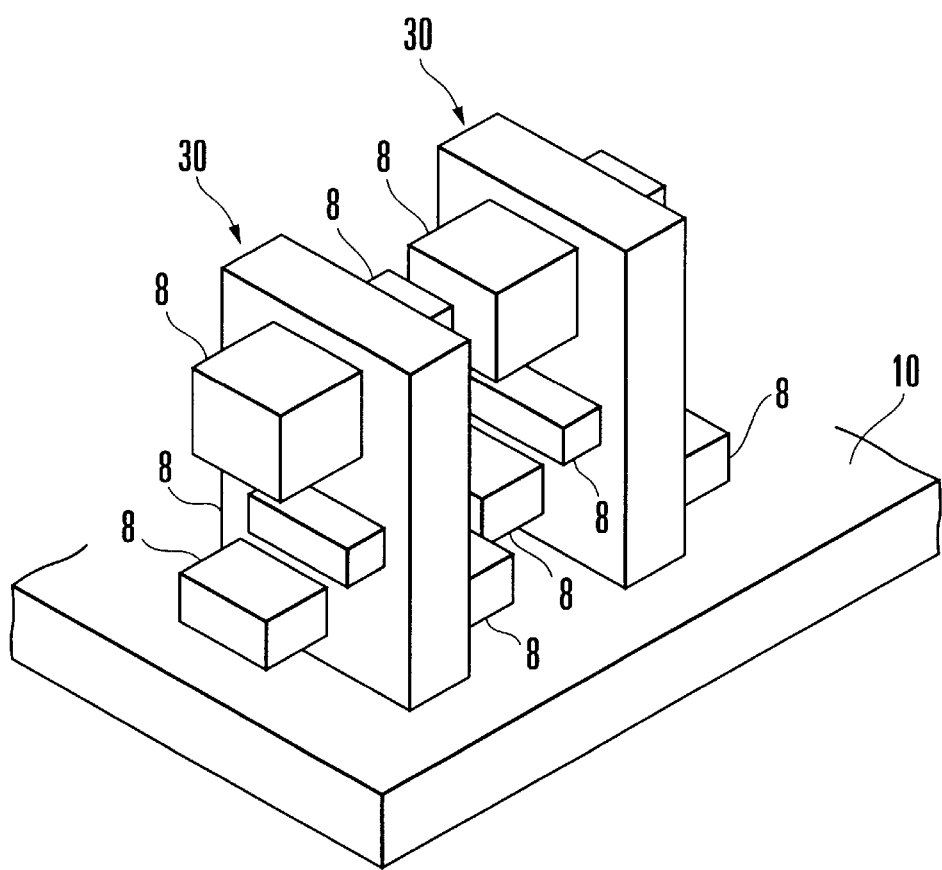
FIG. 11 is a perspective view showing a state wherein the printed wiring boards according to the second embodiment of the present invention, on which the electronic component elements are mounted, are attached to the mother board.

An embodiment in which a printed wiring board 30 formed in the above manner is mounted on a mother board 10 will be described with reference to FIGS. 10 and 11.

First, a large number of electronic component elements 8 are attached to conductor patterns 28a on the upper and lower surfaces of the printed wiring board 30 through a solder 12. After that, the printed wiring board 30 is set on a mother board 10 such that its flat side surface terminal portions 32 are placed on lands 11 of the mother board 10. The resultant structure is then heated, so the printed wiring board 30 is mounted vertically upright on the mother board 10 through the solder 12. In other words, flat side surface terminal portions 32 of conductor terminals, each comprised of a filler 27 charged in a semicylindrical connection holes and having a plating catalytic function, and a metal film that covers the filler 27, serve as the connection terminals of the printed wiring board 30. In this case, the printed wiring board 30 can be set in either the vertical or horizontal direction, and can be mounted upright on the lands 11 of the mother board 10.

In this manner, since the printed wiring board 30 is mounted upright on the mother board 10 through its side surface terminal portions 32, the electronic component elements 8 can be mounted on the upper and lower surfaces of the printed wiring board 30. The number of electronic component elements 8 that can be mounted on one printed wiring board 30 increases to about twice when compared to a conventional case wherein the electronic component elements 8 are mounted on only the upper surface of the printed wiring board 30. In addition, since the printed wiring board 30 is mounted upright on the mother board 10, that side of the printed wiring board 30 which has a smaller surface area opposes the mother board 10. This decreases the area on the mother board 10 which is occupied by the printed wiring board 30. Hence, the number of printed wiring boards 30 that can be mounted on the mother board 10 is increased, so the mounting efficiency of the electronic component elements 8 increases, so high-density mounting of the electronic component elements 8 is enabled.

In the printed wiring board 30 mounted on the mother board 10, the connection holes are filled with the filler and are not hollow, thus forming the connection blind holes. Thus, when the printed wiring board 30 is to be attached to the lands 11 of the mother board 10, the adhesion of the solder 12 with respect to the side surface terminal portions 32 increases. As the upper and lower surface terminal portions 31 and 32 are formed, when the printed wiring board 30 is to be mounted on the mother board 10, the solder 12 attaches to the upper and lower surface terminal portions 31 and 32 as well. Therefore, not only the printed wiring board 30 is firmly mounted on the mother board 10, but also the connection resistance between the side surface terminal portions 32 and lands 11 decreases, thus reducing connection failures.

Third Embodiment

FIG. 12 and FIGS. 13A to 13H show the third embodiment of the present invention.

Figure 12:
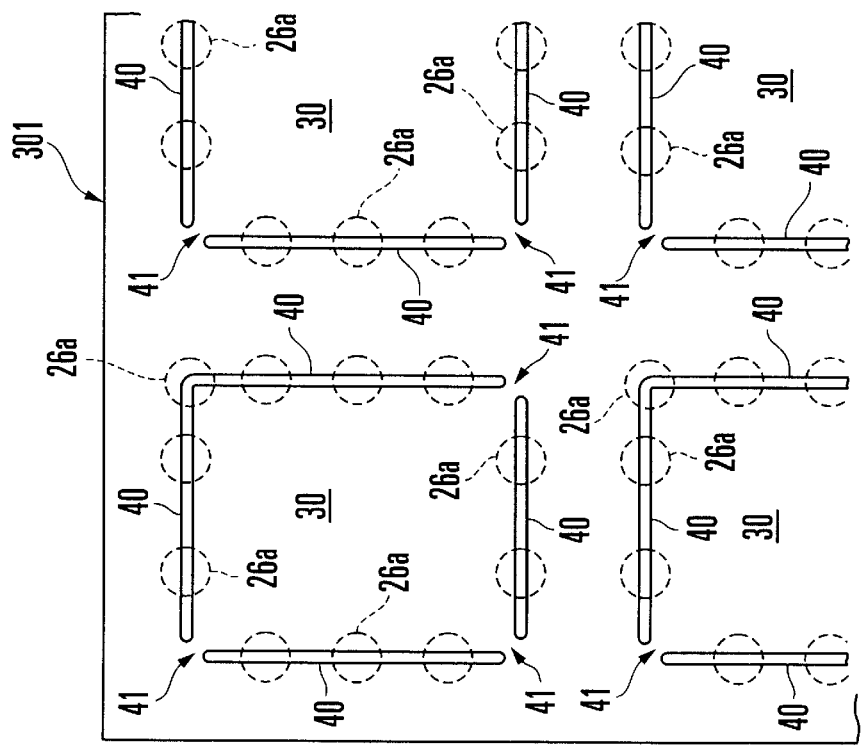
FIG. 12 is a plan view showing a printed wiring board according to the third embodiment of the present invention.

In the third embodiment, the steps shown in FIGS. 13A to 13D are identical to those shown in FIGS. 2A to 2D. After the circuit formation step shown in FIG. 13E, the router machining step shown in FIG. 13F is performed. Hence, as shown in FIG. 12, in order to separate a large number of individual printed wiring boards 30 from a large-sized printed wiring board 301, sets of slit holes 40, each set consisting of three slit holes to form a substantially rectangular shape, are formed partly across connection blind holes 26a, which are obtained by filling a large number of connection through holes 26, formed by drilling along the outlines or cutting lines that define printed wiring boards, with a filler such as a copper paste having a plating catalytic function. The third embodiment is different from the above first embodiment in that three remaining portions 41 each with a small area are formed between the three slit holes 40. Thus, while the respective printed wiring boards 30 are not separated from the large-sized printed wiring board 301 at the left portions 41, the entire large-sized printed wiring board 301 is subjected to a metal plating process in the step shown in FIG. 13G.

More specifically, as the filler 27 having a plating catalytic function is charged in the connection through holes 26, even if a plating catalytic process is not performed, particles 27a (copper particles if the filler is copper paste in FIG. 5) in the filler 27 serve as an anchor, thus improving the adhesion properties between the copper paste 27 and metal plating films. No metal plating films are formed on metal conductors or on portions other than the filler such as the copper paste 27 having a plating catalytic function.

Figures 13A, 13B, 13C, 13D, 13E, 13F, 13G, 13H:
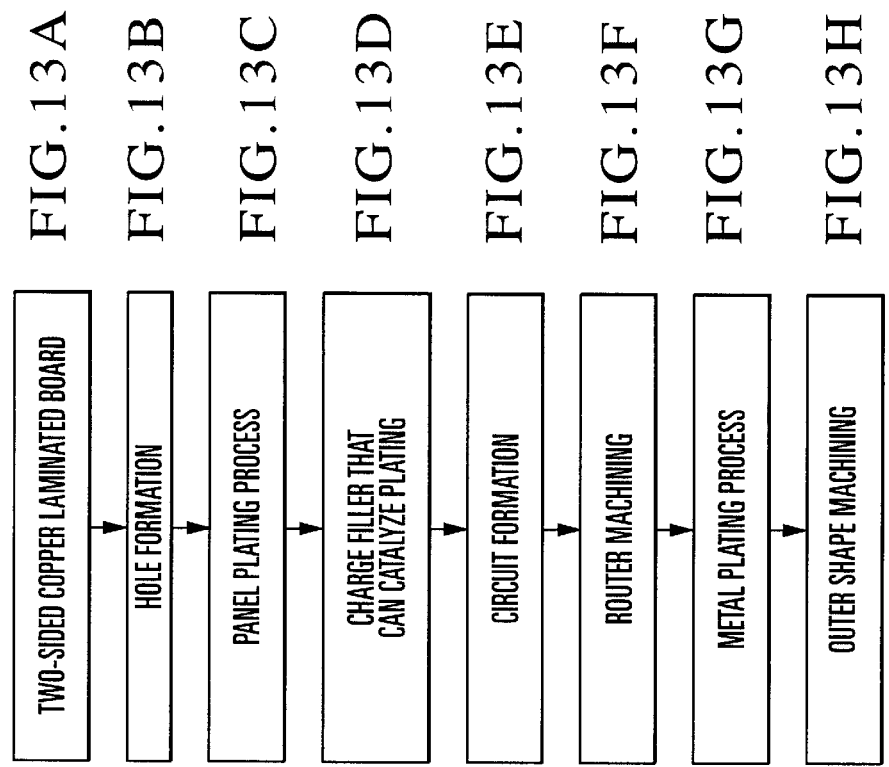
FIGS. 13A to 13H are views showing the flow chart for explaining a method of manufacturing the printed wiring board shown in FIG. 12.

After the metal plating process of FIG. 13G, the remaining portions 41 are notched in outer shape machining shown in FIG. 13H, thereby separating the large number of printed wiring boards 30 from the large-sized printed wiring board 301 at the slit holes 40.

In this manner, as the metal plating process is performed at once and not for the individual ones of the large number of printed wiring boards 30 separately, the productivity increases. When the metal plating process is to be performed, since the large-sized printed wiring board 301 with a larger outer shape than that of each printed wiring board 30 with a smaller outer shape can be clamped, the workability is improved and the quality is stabilized. The large number of printed wiring boards 30 can be subjected to the metal plating process by only clamping the large-sized printed wiring board 301 once. Accordingly, the area of the clamped portion which is not subjected to the metal plating process can be minimized. Thus, the large-sized printed wiring board 301 is effectively used, thus decreasing the manufacturing cost.

The mounting efficiency of electronic component elements 8 is improved, so high-density mounting can be performed. Alternatively, connection through holes 26 may be filled with a filler 27 having a plating catalytic function, so they form connection blind holes 26a, and then electronic component elements may be mounted on a large-sized printed wiring board 301. After that, slit holes 40 may be formed in the printed wiring board 301 to leave portions 41 on cutting lines 29 that cut across the connection blind holes 26a. Plating conductors may be formed on the cutting sections and the upper surfaces (exposed surfaces) of the filler 27 which are in contact with the slit holes 40. After that, the printed wiring board 301 may be cut to separate a large number of printed wiring boards 30. In this case, the electronic component elements 8 need not be mounted after the large number of individual small printed wiring boards 30 are separated from the large-sized printed wiring board 301. Hence, a high component mounting efficiency can be obtained, and the electronic component elements can be further downsized.

In this embodiment, conductor patterns 28a are formed on only one surface of the printed wiring board 30. However, conductor patterns 28a can naturally be formed on the two surfaces of the printed wiring board 30, and this structure can be applied to a multilevel printed wiring board as well.

In the above embodiments, the nonconductive or conductive copper paste is used as the filler. Alternatively, the filler can be a paste containing metal powder, e.g., gold, silver, tin, nickel, or palladium. It suffices as far as the filler has a plating catalytic function. Powder of at least one of these materials is mixed in an insulating material such as an epoxy resin, thus forming the paste-like filler described above.

In the above embodiments, the lower surfaces of the connection grooves 26b are covered with the metal plating films to form the lower surface terminal portions 33. The lower surface terminal portions 33 need not always be formed, but the lower surfaces of the connection grooves 26b may be covered with a solder resist as an insulating material. It suffices as far as at least the upper and side surfaces of each connection groove 26b are covered with a metal plating film.

The third embodiment shown in FIG. 12 has the three remaining portions 41. Alternatively, the number of remaining portions may be one, four, or more. It suffices as far as the individual printed wiring boards 30 are not separated from the large-sized printed wiring board 301 by router or slitter machining before the outer shape machining step of FIG. 13H.

As has been described above, according to the present invention, since the side surface terminal portions are formed by cutting the blind holes formed by drilling, they can be formed at high precision. As a result, not only the printed wiring board can be downsized, but also high-density mounting of the electronic component elements can be performed.

According to the present invention, not only the workability is improved, but also the cost is reduced, and the adhesion properties of the plating conductors are improved because of the plating catalytic function of the filler. Thus, the manufacturing quality of the printed wiring board to be formed is stabilized. Since the connection through holes are filled with the filler, when the connection blind holes are to be cut to form the side surface terminal portions, no burr will be formed, so the printed wiring board manufacturing quality is improved.

According to the present invention, the pattern conductors on the upper and lower surfaces of the printed wiring board can be connected to each other with a two-layered parallel conductor formed of a plating conductor on the inner wall of the through groove and a plating conductor covering the exposed surface of the filler that fills the through groove, thus achieving a high connection reliability.

According to the present invention, the connection strength between the base material of the printed wiring board and the side surface connecting portions can be greatly improved. Thus, the quality is stabilized with respect to the weight and load, so the reliability is improved.

According to the present invention, since the adhesion properties of the plating film are improved by the plating catalytic function of the filler, the quality is stabilized. Since the filler fills the connection through holes to form the connection blind holes, when the connection blind holes are to be cut to form the side surface terminal portions, no burr will be formed, so the quality is improved.

What is claimed is:

1. An electronic component device comprising a printed wiring board (30) including a side surface terminal portion (32) with a smooth outer periphery end surface formed of a groove (26b) made in a concave shape extending from an upper surface to a lower surface on a side surface, or a corner adjacent to the side surface, of the printed wiring board (30), a plating conductor (25) covering the inner wall, a filler (27) which fills the groove and has a plating catalytic function, and another plating conductor (28) covering an exposed surface of the filler.

2. A device according to claim 1, wherein a maximum width (d1) of the groove of a buried portion is formed larger than a groove width (d2) exposed to an outer periphery side surface of the groove formed in a concave shape on the side surface, or the corner adjacent to the side surface, of the printed wiring board.

3. A device according to claim 1, wherein an electronic component element is directly connected to a side surface terminal portion (32) formed on an outer periphery end surface of the side surface of the printed wiring board.

4. A device according to claim 1, wherein the printed wiring board stands upright on another board, and the printed wiring board and the other board are connected to each other through a side surface terminal portion (32) formed on an outer periphery end surface of the printed wiring board.

5. An electronic component device comprising a printed wiring board formed of an individual printed wiring board (30) formed by dividing a large-sized printed wiring board (301) into a large number of individual wiring boards, a separation slit hole (40) formed on a substantial outline of a printed wiring board to be formed (30), a groove (26b) overlaid on the slit hole (40) and formed in a concave shape extending from an upper surface to a lower surface on a side surface, or a portion corresponding to a corner adjacent to the side surface, of the printed wiring board (30) to be formed, and a plating conductor (25) covering an inner-wall of the groove, a filler (27) which fills the groove and has a plating catalytic function, and another plating conductor (28) covering an exposed surface of the filler.

* * * * *